(12) United States Patent
Chou et al.

(10) Patent No.: US 10,354,792 B2
(45) Date of Patent: Jul. 16, 2019

(54) TRANSFORMER STRUCTURE

(71) Applicant: SEA SONIC ELECTRONICS CO., LTD., Taipei (TW)

(72) Inventors: Sheng-Chien Chou, Taipei (TW); Chih-Sheng Chang, Taipei (TW)

(73) Assignee: SEA SONIC ELECTRONICS CO., LTD., Taipei (TW)

(*) Notice: Subject to any disclaimer, the term of this patent is extended or adjusted under 35 U.S.C. 154(b) by 128 days.

(21) Appl. No.: 15/790,403

(22) Filed: Oct. 23, 2017

(65) Prior Publication Data

US 2019/0122806 A1 Apr. 25, 2019

(51) Int. Cl.
| | |
|---|---|
| *H01F 27/08* | (2006.01) |
| *H01F 27/29* | (2006.01) |
| *H01F 27/28* | (2006.01) |
| *H01F 27/06* | (2006.01) |
| *H05K 1/14* | (2006.01) |
| *H01F 27/24* | (2006.01) |

(52) U.S. Cl.
CPC ......... *H01F 27/2804* (2013.01); *H01F 27/06* (2013.01); *H01F 27/08* (2013.01); *H01F 27/24* (2013.01); *H05K 1/141* (2013.01)

(58) Field of Classification Search
CPC ...... H01F 27/2804; H01F 27/06; H01F 27/08; H01F 27/24; H01F 27/22; H01F 27/2823; H01F 27/2847; H01F 27/2866; H01F 27/29; H01F 17/06; H01F 17/062; H01F 17/065; H01F 2027/2814; H01K 1/141
USPC ... 336/55, 61, 220–221, 170, 175, 176, 192; 361/720, 722
See application file for complete search history.

(56) References Cited

U.S. PATENT DOCUMENTS

| | | | | |
|---|---|---|---|---|
| 5,602,723 | A | * 2/1997 | Takahashi | H05K 7/1422 257/659 |
| 5,835,350 | A | * 11/1998 | Stevens | H02M 3/00 361/704 |
| 2002/0054480 | A1 | * 5/2002 | Jitaru | H01F 27/06 361/704 |
| 2008/0272874 | A1 | * 11/2008 | Chang | H01F 27/29 336/61 |

(Continued)

FOREIGN PATENT DOCUMENTS

| | | |
|---|---|---|
| TW | I324351 B | 5/2010 |
| TW | I359429 B | 3/2012 |

*Primary Examiner* — Mang Tin Bik Lian
(74) *Attorney, Agent, or Firm* — Muncy, Geissler, Olds & Lowe, P.C.

(57) ABSTRACT

A transformer structure includes a circuit board, a current bearing plate, a transformer iron core, two wire windings and two plate windings. The circuit board is provided with a rectification filter circuit at least including a filter inductor, a filter capacitor and a rectification switch. The filter inductor is formed by a current guide plate on the circuit board and an inductor iron core sleeved on the current guide plate. The current bearing plate is stacked on the circuit board and electrically connected to the rectification filter circuit. The transformer iron core is on the circuit board. The two plate windings are plate materials, and are wound for at least one turn on the transformer iron core and fixed on the circuit board. The plate windings are electrically connected to the current guide plate and the current bearing plate to jointly withstand a current flowing through the transformer structure.

9 Claims, 4 Drawing Sheets

(56) References Cited

U.S. PATENT DOCUMENTS

| | | | | |
|---|---|---|---|---|
| 2009/0309684 A1* | 12/2009 | Tsai | ................ | H01F 27/2866 336/105 |
| 2010/0237971 A1* | 9/2010 | Ikezawa | ............... | H01F 27/22 336/61 |
| 2014/0029324 A1* | 1/2014 | Sanae | ................ | H05K 7/209 363/141 |
| 2014/0321065 A1* | 10/2014 | Nishimura | ........... | H05K 1/0203 361/722 |
| 2015/0245537 A1* | 8/2015 | Sakuma | ............... | H01F 27/085 363/141 |

* cited by examiner

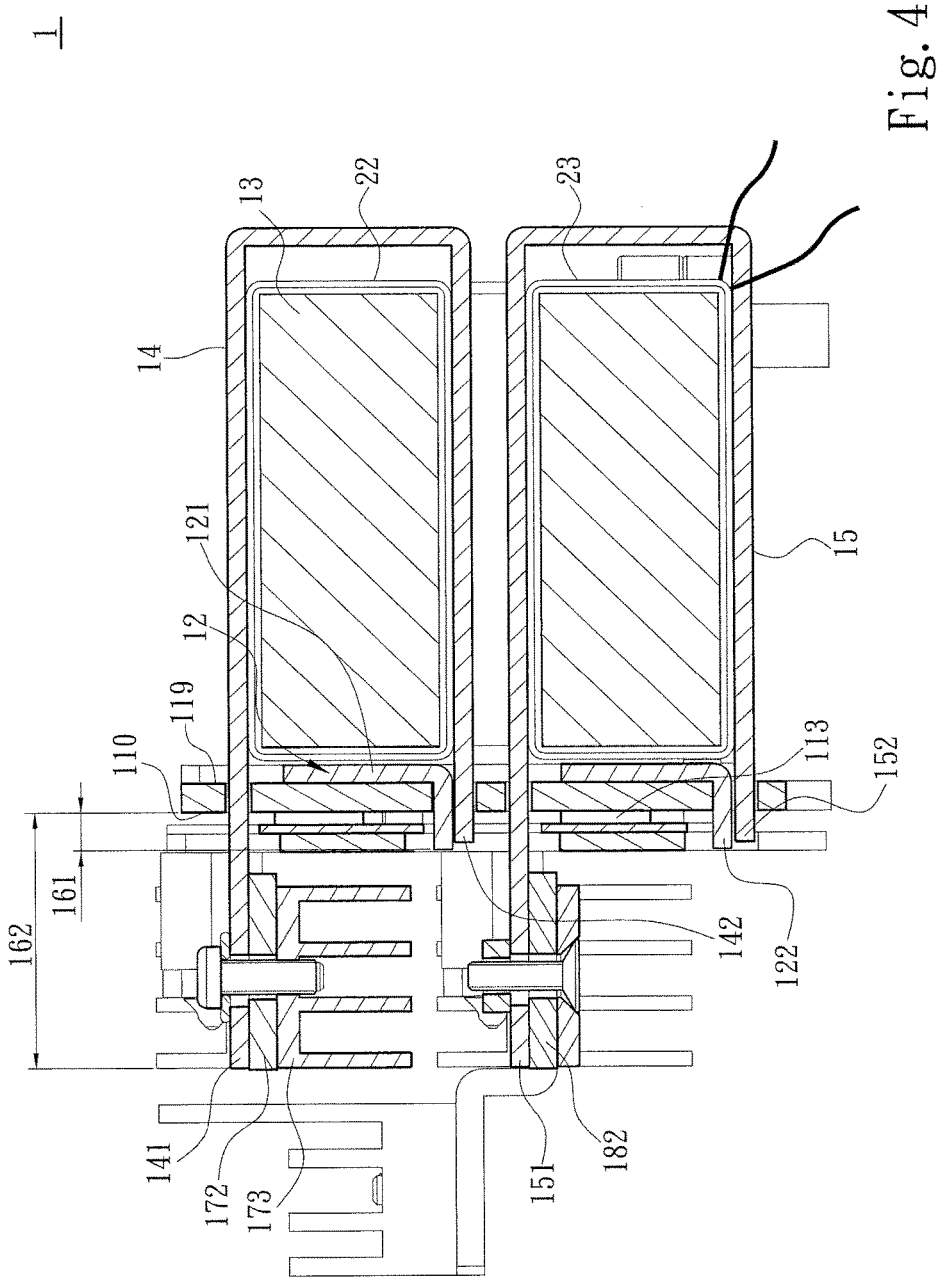

//---

TRANSFORMER STRUCTURE

FIELD OF THE INVENTION

The present invention relates to a transformer structure, and particularly to a transformer structure having a high power density and capable of withstanding a large current and efficiently dissipating heat.

BACKGROUND OF THE INVENTION

There are numerous transformer structures that pursue higher power densities and are implemented by integrated structures. Some examples are as disclosed by Taiwan Patent Nos. I324351 and I359429.

However, the above patents focus on only higher power densities and have not taken into account current withstand capabilities of the transformer structures, such that these patents cannot be effectively applied to common high-power operating conditions.

Further, because the above transformer structures have not taken into account the current withstand capabilities of transformers, temperature rise is quite significant during the implementation of the transformers, resulting in lowered efficiency of the transformers. In addition, if an external heat dissipation device is needed for heat dissipation, the goal of the expected high-power density of the transformer structures may be drastically compromised.

SUMMARY OF THE INVENTION

It is a primary object of the present invention to solve the issues of the incapability of withstanding a large current and an unsatisfactory heat dissipation effect of a conventional structure.

To achieve the above object, the present invention provides a transformer structure including a circuit board, a current bearing plate, a transformer iron core, two wire windings and two plate windings. The circuit board is provided with a rectification filter circuit, which at least includes a filter inductor, a filter capacitor and a rectification switch. The filter inductor is Ruined by a current guide plate disposed on the circuit board, and an inductor iron core sleeved on the current guide plate. The current guide plate comprises a first terminal assembled with the circuit board, and a second terminal not assembled with the circuit board and connectable to an external circuit. The current bearing plate includes a plate body stacked on the circuit board, and a plurality of connecting ends extended integrally from the plate body, for fixing the current bearing plate on the circuit board and electrically connected to the rectification filter circuit. The transformer iron core is placed on the circuit board. The two wire windings are wound on the transformer iron core to form a primary side of the transformer, respectively. The two plate windings are wound for at least one turn on the transformer core and fixed on the circuit board, and form a secondary side of the transformer. The two plate windings, the two wire windings and the transformer iron core form a transformer. The two plate windings are electrically connected to the current guide plate and the current bearing plate to jointly withstand the current flowing through the transformer structure.

In one embodiment, the circuit board comprises a plurality of through holes for penetratingly disposing the current guide plate, the current bearing plate or the two plate windings.

In one embodiment, the circuit board comprises a first surface and a second surface that are parallel. The filter inductor, the current bearing plate, the transformer iron core, the filter capacitor and the rectification switch are disposed on the circuit board. The first terminal of the current guide plate protrudes from the second surface, and is electrically connected to the filter capacitor and the rectification switch. Ends of the two plate windings assembled with the circuit board are penetrated to the second surface through the first surface, and are electrically connected to the rectification filter circuit.

In one embodiment, each of the two plate windings comprises a first end and a second end. The first end is spaced from the second surface by a first distance, and the second end is spaced from the second surface by a second distance. The first distance is smaller than the second distance. The transformer structure includes two heat sinks respectively disposed at the first ends.

In one embodiment, the long side of each of the heat sinks is perpendicular to the long side of each of the two plate windings.

In one embodiment, the transformer structure includes a plurality of insulation support rods, which are disposed correspondingly to the second surface of the circuit board so as to connect to one of the heat sinks. Each of the heat sinks comprises at least one installation hole assembled with one of the plurality of insulation support rods.

In one embodiment, each of the heat sinks includes a heat sink body connected to one of the first ends, and a cooling fin disposed on the heat sink body.

In one embodiment, the transformer structure includes a heat insulation plate stacked on the second surface and at least covering the rectification switch.

In one embodiment, the transformer structure includes a heat diversion plate disposed on the second surface and stacked on the heat insulation plate.

With the embodiments disclosed above, the present invention provides following features compared to the prior art. In the present invention, the two plate windings are electrically connected to the current guide plate and the current bearing plate to jointly withstand the current flowing through the transformer structure, enhancing the overall current withstanding capability of the transformer structure. Further, the two plate windings, the current guide plate and the current bearing plate are implemented by plate materials and thus provide a larger heat dissipation area, allowing heat generated by the transformer structure in operation to be more substantially dissipated.

BRIEF DESCRIPTION OF THE DRAWINGS

FIG. 4 is a section schematic diagram of a structure according to an embodiment of the present invention.

DETAILED DESCRIPTION OF THE PREFERRED EMBODIMENTS

Details and technical contents of the present invention are given with the accompanying drawings below.

Figure 1:
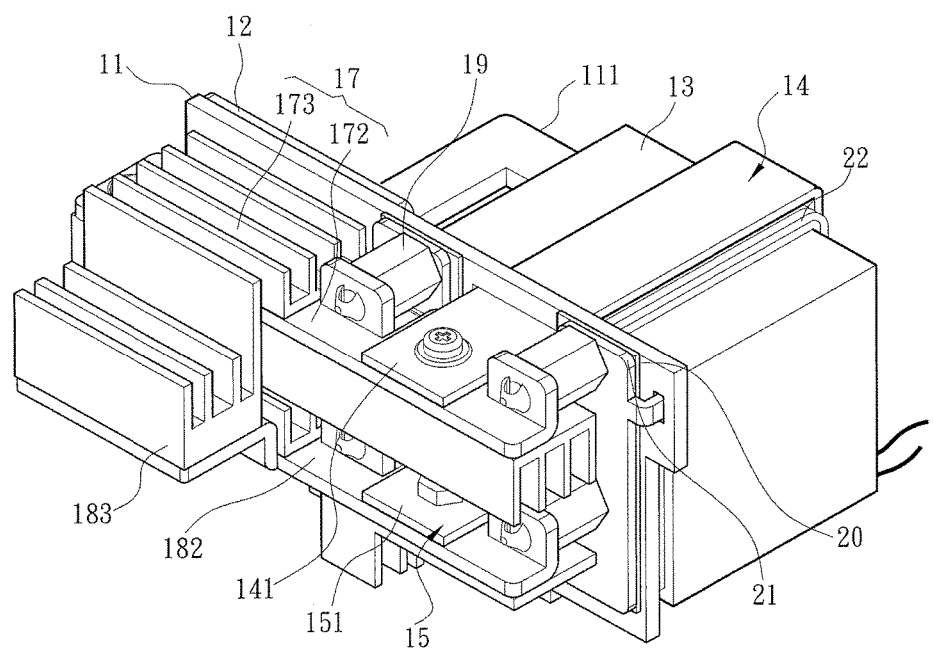
FIG. 1 is an assembly schematic diagram of a structure according to an embodiment of the present invention.
Figure 2:
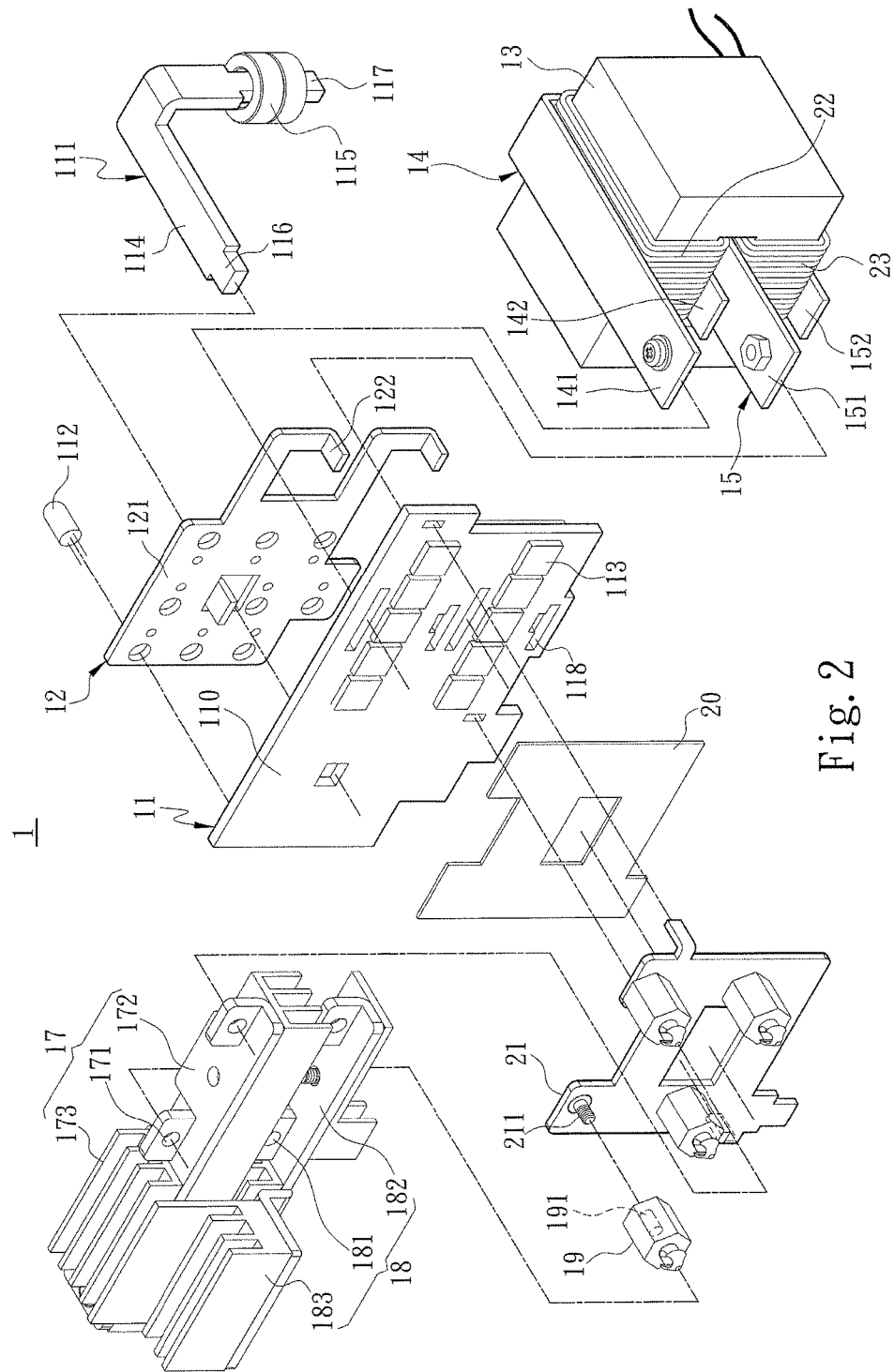
FIG. 2 is an exploded schematic diagram of a structure according to an embodiment of the present invention.
Figure 3:
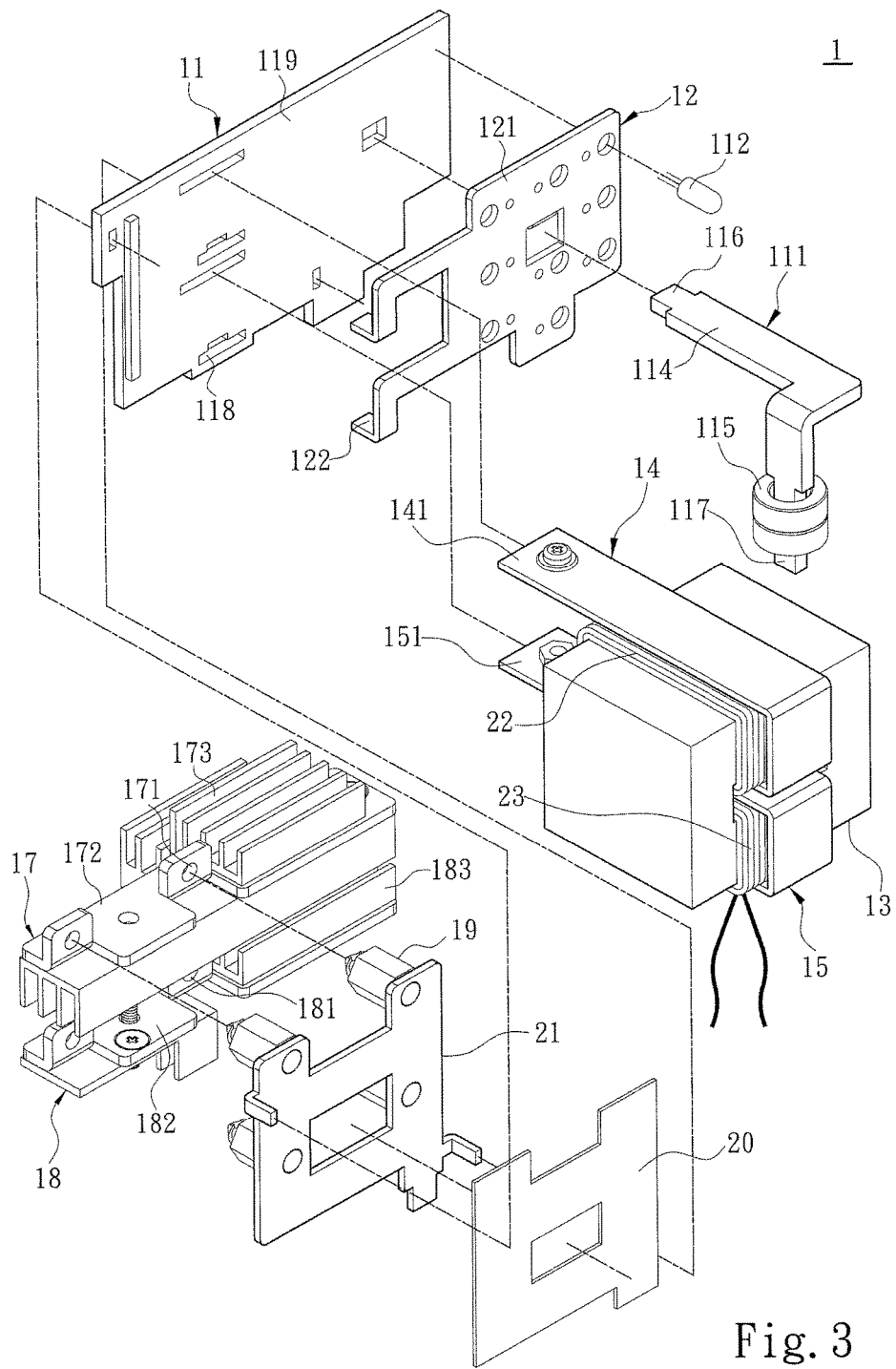
FIG. 3 is an exploded schematic diagram of a structure in another direction according to an embodiment of the present invention.

Referring to FIG. 1, FIG. 2, FIG. 3, and FIG. 4, the present invention provides a transformer structure 1. The transformer structure 1 is in an integrated configuration so as to increase the power density of the transformer structure 1. The transformer structure 1 includes a circuit board 11, a current bearing plate 12, a transformer iron core 13, two plate windings 14, 15 and two wire windings 22, 23. The circuit board 11 is a printed circuit board (PCB), and includes a conductive wire (not shown) thereon. Further, the circuit board 11 is provided with a rectification filtering circuit, which at least includes a filter inductor 111, a filter capacitor 112 and a rectification switch 113. The filter inductor 111, the filter capacitor 112 and the rectification switch 113 form an electrical connection via the conductive wire. The filter inductor 111 is formed by a current guide plate 114 provided on the circuit board 11 and an inductor iron core 115 sleeved on the current guide plate 114. The current guide plate 114 is in fact an electrically conductive plate material, e.g., a coin. The inductor iron core 115 is a ring iron core, and the current guide plate 114 may have a size adaptable to the aperture of the inductor iron core 115. Further, the current guide plate 114 has a first terminal 116 assembled with the circuit board 11, and a second terminal 117 not assembled with the circuit board 11 and connectable to an external circuit.

The current bearing plate 12 includes a plate body 121 stacked on the circuit board 11, and a plurality of connecting ends 122 integrally extended from the plate body 121. The plurality of connecting ends 122 may be extended and formed according to a specific position of the plate body 121, and are for fixing the current bearing plate 12 on the circuit board 11. Further, the plurality of connecting ends 122 are electrically connected to the rectification filter circuit to allow the current flowing in the rectification filter circuit to flow on the current bearing plate 12.

The transformer iron core 13 is placed on the circuit board 11, and provides at least two parts apt for winding. On the other hand, each of the two plate windings 14, 15 is an electrically conductive plate material, and winds for at least one turn on the transformer iron core 13. Both of the plate windings 14, 15 are fixed on the circuit board 11. Further, the two wire windings 22, 23 are wire materials, and each winds for at least one turn on the transformer iron core 13. Further, the two wire windings 23, 23 may be in a serial or parallel connection, and wind around the transformer iron core 13.

The two plate windings 14, 15, the two wire windings 22, 23, and the transformer iron core 13 form a transformer, with the two plate windings 14, 15 being a secondary side of the transformer and the two wire windings 22, 23 being a primary side of the transformer. Further, the plate windings 14, 15 of the present invention are electrically connected to the current bearing plate 12 and the current guide plate 114, such that the four can jointly withstand the current flowing on the transformer structure 1. More specifically, in the present invention, the current guide plate 114, the current bearing plate 12 and the two plate windings 14, 15 are in a plate-like structural design, which provides a greater conductive area compared to a conventional method implemented by wires, hence enhancing the current withstanding capability of the transformer structure 1. In addition, such design also significantly increases the heat dissipation area. Moreover, ends of the two wire windings 22, 23 may be connected to another circuit board to conduct power.

In one embodiment, the circuit board 11 includes a plurality of through holes 118 for penetratingly disposing the current guide plate 114, the current bearing plate 12 or the two plate windings 14, 15. The circuit board 11 comprises a first surface 119 and the second surface 110 that are parallel. The filter inductor 111, the current bearing plate 12, the transformer iron core 13, the filter capacitor 112 and the rectification switch 113 are disposed on the circuit board 11. Further, the filter inductor 111, the current bearing plate 12, the transformer iron core 13 and the filter capacitor 112 are disposed on the first surface 119; the rectification switch 113 is disposed on the second surface 110. The first terminal 116 of the current guide plate 114 protrudes from the second surface 110 and is electrically connected to the filter capacitor 112 and the rectification switch 113. The ends of the two plate windings 14, 15 assembled with the circuit board 11 are penetrated to the second surface 110 through the first surface 119 and are electrically connected to the rectification filter circuit. Further, the two plate windings 14, 15 comprise first ends 141, 151 and second ends 142, 152, respectively. The first ends 141, 151 are spaced from the second surface 110 by a second distance 162, and the second ends 142, 152 are spaced from the second surface 110 by a first distance 161. The first distance 161 is smaller than the second distance 162.

The transformer structure 1 further includes heat sinks 17, 18 disposed at the first ends 141, 151. In addition to increasing the area of the transformer structure 1 for bearing the current, the heat sinks 17, 18 further increase the area for heat dissipation. The long side of each of the heat sinks 17, 18 may further be perpendicular to the long side of each of the two plate windings 14, 15. Thus, without changing the structural dimensions of the transformer structure 1, even a better heat dissipation capability is achieved. Referring to FIG. 1, FIG. 2, FIG. 3 and FIG. 4, in continuation of the foregoing embodiment, the transformer structure 1 includes a plurality of insulation support rods 19, which are disposed correspondingly to the second surface 110 of the circuit board 11 so as to connect to one of the heat sinks 17, 18. Each of the heat sinks 17, 18 includes at least one installation hole 171, 181 assembled with the one of the plurality of insulation support rods 19. Further, each of the heat sinks 17, 18 includes a heat sink body 172, 182 connected to one of the first ends 141, 151, and a cooling fin 173, 183 disposed on the heat sink body 172, 182.

In one embodiment, the transformer structure 1 includes a heat insulation plate 20 stacked on the second surface 110 and at least covering the rectification switch 113, and a cooling diversion plate 21 disposed on the second surface 110 and stacked on the heat insulation plate 20. Further, the cooling diversion plate 21 may be provided thereon with a plurality of installation columns 211 for respectively installing the plurality of insulation support rods 19, and each of the plurality of insulation support rods 19 includes an installation groove 191 for assembling with the plurality of installation columns 211. Further, in the present invention, the plurality of insulation support rods 19, after being assembled, receive effects of the heat sinks 17, 18 and thus abut against the heat insulation plate 20 and the cooling diversion plate 21, ensuring that the heat insulation plate 20 and the cooling diversion plate 21 are securely installed.

What is claimed is:

1. A transformer structure, comprising:
a circuit board, provided with a rectification filter circuit, the rectification filter circuit at least comprising a filter inductor, a filter capacitor and a rectification switch, the filter inductor formed by a current guide plate provided on the circuit board and an inductor iron core sleeved on the current guide plate, the current guide plate comprising a first terminal assembled with the circuit board and a second terminal not assembled with the circuit board and connectable to an external circuit;

a current bearing plate, comprising a plate body stacked on the circuit board, and a plurality of connecting ends extended integrally from the plate body to fix the current bearing plate on the circuit board and electrically connected to the rectification filter circuit;

a transformer iron core, placed on the circuit board;

two wire windings, wound on the transformer iron core to form a primary side of a transformer; and two plate windings, wound for at least one turn on the transformer iron core, and fixed on the circuit board to form a secondary side of the transformer, the two plate windings, the two wire windings and the transformer iron core form a transformer, the two plate windings are electrically connected to the current guide plate and the current bearing plate to jointly withstand a current flowing through the transformer structure.

2. The transformer structure of claim 1, wherein the circuit board comprises a plurality of through holes for penetratingly disposing the current guide plate, the current bearing plate or the two plate windings.

3. The transformer structure of claim 2, wherein the circuit board comprises a first surface and a second surface that are parallel; the filter inductor, the current bearing plate, the transformer iron core, the filter capacitor and the rectification switch are disposed on the circuit board; the first terminal of the current guide plate protrudes from the second surface and is electrically connected to the filter capacitor and the rectification switch; and ends of the two plate windings assembled with the circuit board are penetrated to the second surface through the first surface and are electrically connected to the rectification filter circuit.

4. The transformer structure of claim 3, wherein each of the two plate windings comprises a first end and a second end; the first ends are spaced from the second surface by a second distance, and the second ends are spaced from the second surface by a first distance; the first distance is smaller than the second distance; and the transformer structure comprises two heat sinks respectively disposed at the two first ends.

5. The transformer structure of claim 4, wherein a direction of a long side of each heat sink is perpendicular to a direction of a long side of each of the two plate windings.

6. The transformer structure of claim 5, further comprising a plurality of insulation support rods disposed correspondingly to the second surface of the circuit board so as to connect to one of the heat sink, and each of the heat sinks comprises at least one installation hole assembled with one of the plurality of insulation support rods.

7. The transformer structure of claim 6, wherein each of the heat sinks comprises a heat sink body connected one of the first ends, and a cooling fin disposed on the heat sink body.

8. The transformer structure of claim 7, further comprising a heat insulation plate stacked on the second surface and at least covering the rectification switch.

9. The transformer structure of claim 8, further comprising a heat diversion plate disposed on the second surface and stacked on the heat insulation plate.

* * * * *